(12) United States Patent
Ausserlechner

(10) Patent No.: US 10,317,439 B2
(45) Date of Patent: Jun. 11, 2019

(54) CURRENT SENSOR, SYSTEM AND METHOD

(71) Applicant: Infineon Technologies AG, Neubiberg (DE)

(72) Inventor: Udo Ausserlechner, Villach (AT)

(73) Assignee: Infineon Technologies AG (DE)

( * ) Notice: Subject to any disclaimer, the term of this patent is extended or adjusted under 35 U.S.C. 154(b) by 172 days.

(21) Appl. No.: 15/080,747

(22) Filed: Mar. 25, 2016

(65) Prior Publication Data

US 2016/0291059 A1    Oct. 6, 2016

(30) Foreign Application Priority Data

Apr. 1, 2015   (DE) .................. 10 2015 105 075

(51) Int. Cl.
| | |
|---|---|
| *G01R 27/14* | (2006.01) |
| *G01R 19/32* | (2006.01) |
| *G01R 15/12* | (2006.01) |
| *G01R 1/20* | (2006.01) |
| *G01R 27/16* | (2006.01) |

(52) U.S. Cl.
CPC ............. *G01R 19/32* (2013.01); *G01R 1/203* (2013.01); *G01R 27/14* (2013.01); *G01R 27/16* (2013.01)

(58) Field of Classification Search
CPC ...... G01R 15/12; G01R 15/146; G01R 15/14; G01R 19/32; G01R 27/14; G01R 27/08; G01R 1/203; G01R 27/16; G01R 31/2812; G01R 31/2813; G01R 35/005; G01R 35/007

See application file for complete search history.

(56) References Cited

U.S. PATENT DOCUMENTS

| | | | | |
|---|---|---|---|---|
| 5,426,416 | A | | 6/1995 | Jefferies et al. |
| 5,804,979 | A | * | 9/1998 | Lund ...................... G01R 1/203 324/126 |
| 5,867,054 | A | * | 2/1999 | Kotowski .............. G01R 19/25 327/262 |
| 6,618,684 | B1 | * | 9/2003 | Beroset ................ G01R 11/185 702/99 |
| 2004/0251889 | A1 | * | 12/2004 | Stengel .............. G01R 31/2805 324/763.01 |
| 2005/0127929 | A1 | * | 6/2005 | Petersen ................ B82Y 35/00 324/754.1 |
| 2008/0290879 | A1 | | 11/2008 | Newton et al. |
| 2011/0279133 | A1 | | 11/2011 | Harper et al. |
| 2012/0112365 | A1 | | 5/2012 | Ausserlechner et al. |

FOREIGN PATENT DOCUMENTS

WO      WO 9411745 A1 *  5/1994  .............. G01B 7/06

* cited by examiner

*Primary Examiner* — Son T Le
(74) *Attorney, Agent, or Firm* — Design IP

(57) ABSTRACT

Current sensors, systems and methods are provided. A test current is injected via a pair of force terminals into a conductor and a pair of sense terminals are configured to provide an input signal that corresponds to a voltage drop across the conductor. Based on the test current in the conductor and based on the input signal, a contribution to the voltage drop due to the test current and a contribution to the voltage drop due to a primary current through the conductor may be determined. In addition, at least one of a reference resistance of the conductor and the primary current in the conductor may be further determined.

23 Claims, 7 Drawing Sheets

CURRENT SENSOR, SYSTEM AND METHOD

FIELD

Various embodiments relate to a system, a device, and a method. In particular, various embodiments relate to techniques of determining at least one of a reference resistance of a conductor and a primary current flowing in the conductor.

BACKGROUND

Traditional current sensors employ a shunt. A shunt is typically a low ohmic resistor in the order of 1 mOhm or less; the shunt has a well-defined resistance so that via Ohm's law a current flowing through the shunt can be measured at high accuracy. Typically, a shunt may be made of special alloy composition with zero temperature coefficient of resistivity (TCR). Recently, also plain copper or aluminum shunts are in use—here, a temperature sensor is attached to the shunt which measures the temperature of the shunt and accounts for the nominal TCR.

However, current sensors that employ a dedicated shunt face certain restrictions and drawbacks. For example, current sensors are often used on a substrate or on a printed circuit board (PCB). Typically, in such a scenario a thick copper layer is in the center or core of the laminate or substrate. The current to be measured (e.g., the primary current) flows in the core layer. For current measurements where a dedicated shunt is employed, it is typically required to interrupt the conductor to open the current path in the core layer. Further, the primary current needs to be routed to the surface of the substrate. This makes a design of the system more complex and requires considerable efforts in terms of routing. For example, it may be required to provide a large number of vias. In particular, it may be required that the vias can handle the comparatively large current. Here, it is desirable that the vias do not add a significant resistance to avoid heating of the system and increased power dissipation. The shunt is then soldered or UV-welded to the vias at the top of the substrate.

Further, in a scenario as explained above, typically a predominant part of the primary current needs to flow via solder at interfaces where the primary conductor is interrupted. Typically, a maximum allowable current density is comparably lower in the solder then in the conductor, because the solder is more prone to electromigration. Typically, the solder degrades due to the current flow even when the temperature is moderate. In consequence, it is typically required to employ comparatively large areas for the solder interfaces to avoid wear out. This, in turn, increases the required space of the substrate. Typically, this results in an increase of costs.

Further, relying on shunts can cause comparably high insertion losses and, thus, a large power is typically wasted for the current measurement.

A further disadvantage of employing a dedicated shunt is that a difference in Seebeck-coefficients of the employed materials may give rise to thermo offset. This may be the case if the shunt is made from a particular alloy having a constant TCR while sense contacts that detect a voltage drop over the shunt are made from electrolytic copper. Such a material pairing typically gives rise to thermo offsets when the two sense contacts are at different temperatures. This will cause a zero-point error of the current measurement. Moreover, such errors that are caused by thermo offsets typically exhibit a poorly defined lifetime drift which makes them difficult to compensate for.

SUMMARY

According to an exemplary embodiment, a system is provided. The system comprises a conductor and at least one first electrical contact coupled to the conductor at a first position. The system further comprises at least one second electrical contact coupled to the conductor at a second position. The first position and the second position are arranged at a distance with respect to each other. The system further comprises a pair of force terminals configured to inject, via the at least one first electrical contact and the at least one second electrical contact, a test current into the conductor. The system further comprises a device. The device comprises a microelectronic package and a memory. The memory is configured to store a predetermined reference resistance associated with the conductor. The device further comprises a pair of sense terminals. The pair of sense terminals is configured to provide an input signal related to a voltage drop across the conductor between the at least one first electrical contact and the at least one second electrical contact. The device further comprises at least one processor. The at least one processor is configured to determine a primary current through the conductor based on the input signal and the predefined reference resistance.

According to a further exemplary embodiment, a device is provided. The device comprises a microelectronic package and a pair of sense terminals configured to provide an input signal related to a voltage drop across the conductor. The device further comprises at least one processor. The at least one processor is configured to determine, based on a test current in the conductor and based on the input signal, a contribution to the voltage drop due to the test current. The at least one processor is further configured to determine a contribution to the voltage drop due to a primary current through the conductor. The at least one processor is further configured to determine the primary current.

According to a further exemplary embodiment, a method is provided. The method comprises injecting, via a pair of force terminals, a test current into a conductor. The method further comprises receiving, via a pair of sense terminals, an input signal related to a voltage drop across the conductor. The method further comprises determining, based on the test current and further based on the input signal, a contribution to the voltage drop due to the test current. The method further comprises determining a contribution to the voltage drop due to a primary current. The method further comprises determining at least one of a reference resistance of the conductor and the primary current.

It is to be understood that the features mentioned above and features yet to be explained below can be used not only in the respective combinations indicated, but also in other combinations or in isolation. Features of the above-mentioned aspects and embodiments may be combined with each other in other embodiments.

BRIEF DESCRIPTION OF THE DRAWINGS

The foregoing and additional features and effects will become apparent from the following detailed description when read in conjunction with the accompanying drawings, in which like reference numerals refer to like elements.

DETAILED DESCRIPTION

Figure 1A:
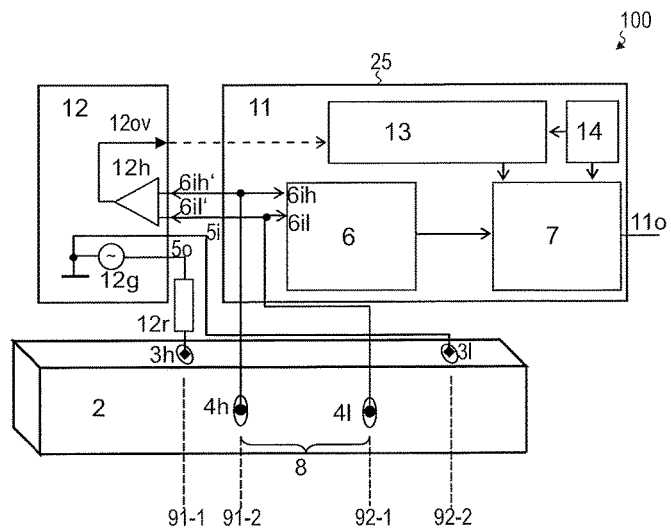
FIG. 1A illustrates a schematic diagram of a system according to one or more exemplary embodiments.

In the following, exemplary embodiments will be described in detail with reference to the accompanying drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided.

In exemplary embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques are described that allow determining or measuring a primary current. According to one or more exemplary embodiments, it may be possible to determine the primary current employing a comparably simple circuit design. For example, according to one or more exemplary embodiments, a dedicated shunt may not be required This may allow measuring the primary current directly in a primary conductor. The primary conductor may be contiguous in-between a pair of sense contacts and may be arranged in a center layer of a substrate such as a PCB.

In view of the above, a current sensor, current sensing system and/or current sensing method may be provided that does not require a dedicated shunt.

Generally, it should be understood that while, according to one or more exemplary embodiments, a dedicated shunt may not be required, according to further embodiments it is possible to include a dedicated shunt.

In view of one or more exemplary embodiments, it may be possible to determine the primary current at a comparably high accuracy. In particular, it may be possible, according to one or more exemplary embodiments, to determine the primary current based on a test current of known properties.

According to one or more exemplary embodiments, a test current may be injected, via a pair of force terminals, into the primary conductor. Generally, the injecting of the test current may be executed in a planning or calibration phase, i.e., some time before the actual measurement of the primary current. Based on the test current, a reference resistance of the conductor may be determined. During the measurement of the primary current, the reference resistance may act as a reference to determine the primary current, e.g., from Ohm's law.

In particular, in such a scenario, it is possible that, between the calibration phase and the executing of the actual measurement, a temperature of the primary conductor changes (i.e., temperature drift). In such a scenario, techniques may be provided for compensating for the temperature drift.

Generally, it is also possible that the injecting of the test current occurs during the actual measurement of the primary current. Then, it may not be desired to compensate for any temperature drifts; however, it may be desired to provide a current generator for providing the test current. In such scenarios, the calibration phase may not be executed before the measurement of the primary current is performed.

Generally, according to one or more exemplary embodiments, the resistance of the primary conductor is determined based on the test current having well-known properties such as frequency spectrum, time spectrum, and/or amplitude. Here, it is possible to measure the voltage drop across the primary conductor in-between a first electrical contact and a second electrical contact due to the test current. From this, the reference resistance may be derived. Based on the determined reference resistance of the primary conductor, it is then possible to infer the primary current, e.g., via Ohm's law. For example, the reference resistance may be later employed during a subsequent measurement of the primary current where the test current is not available. Thus, the reference resistance may be employed as a reference for subsequent measurements of the test current.

For example, the reference resistance may correspond to a ratio between the voltage drop across the conductor between the at least one first electrical contact and the at least one second electrical contact due to the primary current on the one hand side, and due to the test current on the other hand side. A ratio between the voltage drop across the conductor between the at least one first electrical contact and the at least one second electrical contact is typically expected to differ from the reference resistance, because there may be a systematic difference between, e.g., a spatial distribution, of the test current and the primary current. For example, it may be required to consider a factor that accounts for such deviations. The factor can be determined from calibration measurements. As explained above, the temperature drift may be considered by the reference resistance.

Sometimes, during measurement of the voltage drop, the primary current and the test current may be superimposed; this may require separating contributions to the voltage drop due to the test current on the one hand side and due to the primary current on the other hand side. Specifically, here it is possible that a contribution to the voltage drop due to the test current is determined and, from this, the resistance of the conductor may be derived. Further, based on the determined contribution to the voltage drop due to the test current and/or the resistance of the conductor, a contribution to the voltage drop due to the primary current can be determined. Then, it is possible to determine at least one of a reference resistance of the conductor and the primary current flowing through the conductor.

As can be seen from the above, in such techniques—due to known properties of the test current—it is possible to discriminate between the contributions to the voltage drop originating from the test current and the primary current. Then, based on the test current, the resistance of the primary conductor may be determined. This, in turn, allows determining the primary current at high accuracy. Thus, specifically, it is possible to compute a ratio of the voltage drops between the first and second electrical contacts due to the primary current and the test current.

Generally, the known properties of the test current as mentioned above can widely vary. For example, it may be possible that the test current is modulated by a first predefined time-dependent sequence. Then, it may be possible to determine the contribution to the voltage drop due to the test current by using a second predefined sequence. The second predefined sequence may have a deterministic predefined relation to the first sequence. It is possible that the first predefined sequence equals the second predefined sequence. In one or more exemplary embodiments, at least one of the first predefined sequence and the second predefined sequence may be periodic signals such as pulse shapes or a sinewaves. Generally, it may be possible to discriminate between the test current and the primary current in at least one of frequency domain and time domain. Lock-in amplification and/or spread-spectrum techniques may be employed. Alternatively or additionally to separation in frequency domain, multiplexing in time between the test current and the primary current is possible. For example, certain time periods can be relied upon when only the test current is present while the primary current vanishes. During said time periods, it can be possible to obtain the reference resistance without significant interference from the primary current. Since the test current and the corresponding voltage drop across the conductor in-between the sense terminals is known, the primary current can be measured with or without simultaneous test current flow; this is because the system can subtract the test current contribution to the sense signal from the measured sense signal.

Turning to FIG. 1A, a system 100 according to various exemplary embodiments is depicted. The system 100 includes a sensor, a conductor, and a pair of sense terminals for measuring a voltage drop across the conductor according to one or more exemplary embodiments, wherein a lock-in-amplifier (LIA) is externally connected to a pair of force terminals and the pair of sense terminals of the system.

In particular, the system 100 comprises a sensor 11, a LIA 12, and a primary conductor 2. The sensor 11 comprises a voltage measurement device 6, a processor 7 implementing a combining circuit, a temperature sensor 14, and a memory 13. The sensor 11 comprises a microelectronic package 25 as a housing. The sensor 11 comprises an interface 11$o$ via which the determined primary current may be read out and/or via which commands may be received.

The system 100 comprises a pair of sense terminals 6$ih$, 6$il$. The system 100 further comprises a pair of force terminals 5$i$, 5$o$. The sense terminals 6$ih$, 6$il$ may receive an input signal corresponding to the voltage drop. Via the force terminals 5$i$, 5$o$, the test current may be injected. The sense terminals 6$ih$, 6$il$ and/or the force terminals 5$i$, 5$o$ may be implemented as contact pads or contacts in the microelectronic package 25.

Further, the system 100 comprises first electrical contacts 3$h$, 4$h$ and second electrical contacts 3$l$, 4$l$ that are electrically connected with the sense terminals 6$ih$, 6$il$ and the force terminals 5$i$, 5$o$, respectively. The first electrical contacts 3$h$, 4$h$ are arranged at first positions 91-1, 91-2 of the conductor 2. Likewise, the second electrical contacts 3$l$, 4$l$ are arranged at second positions 92-1, 92-2 of the conductor 2. During operation, the input signal is received via the sense terminals 6$ih$, 6$il$, the input signal being related to a voltage drop across the conductor 2 in-between the sense contacts 4$h$, 4$l$. From the input signal, the primary current in the conductor 2 may be derived. Thus, the region of the conductor 2 in-between the sense contacts 4$h$, 4$l$ may be referred to as effective shunt portion 8.

Via first electrical contacts 3$h$, 4$h$ and via the second electrical contacts 3$l$, 4$l$, an electrical connection between the primary conductor 2 and the pair of sense terminals 6$ih$, 6$il$ and a pair of force terminals 5$o$, 5$i$ is established, respectively. The electrical contacts 3$h$, 3$l$ are referred to as force contacts 3$h$, 3$l$.

Via a voltage generator 12$g$ of the LIA 12 and a resistor 12$r$ it is possible to inject a well-defined test current into the primary conductor 2 via the force contacts 3$h$, 3$l$. A resistance of the resistor 12$r$ may be significantly larger than the resistance of the conductor 2 in-between the force contacts 3$h$, 3$l$. The LIA 12 is connected to the force terminals 5$i$, 5$o$. Further, the LIA 12 is connected to the pair of sense terminals 6$ih$, 6$il$. It is possible that the LIA 12 is configured to determine the contribution to the voltage drop between the pair of sense terminals 4$l$, 4$h$ due to the test current. In particular, it is possible that corresponding information is written to a memory 13 of the sensor 11 of the system 100. For example, a reference resistance of the primary conductor 2 may be written to the memory 13. For this, the LIA 12 comprises a control signaling path. It is possible that—in addition to the reference resistance—also the temperature during determining of the reference resistance is obtained from the temperature sensor 14 and written to the memory 13.

Based on the reference resistance and further based on an input signal received via the pair of sense terminals 6$ih$ 6$il$, the processor 7 may determine the primary current through the conductor 2. For this, the voltage measurement device 6 determines the voltage drop across the effective shunt portion 8. The processor 7 receives the reference resistance from the memory 13; it may then determine the primary current based on the voltage drop and based on the reference resistance.

Generally, there are various possibilities of determining the primary current. As mentioned above, this may be based on Ohm's law. For example, the processor 7 may divide the voltage drop across the conductor 2 in-between the sense contacts 4h, 4l. A factor may be multiplied to this value such that the factor may be close to or approximately 1.0, e.g., between 0.8 and 1.2. The temperature drift may be compensated, e.g., by a linear or quadratic model. Details of the calculation may vary depending on the implementation.

Optionally, the processor 7 may take into account the temperature during determining of the reference resistance and a present temperature. Temperature drifts may be taken into account by considering the TCR of the conductor 2. For example, the temperature sensor 14 may determine a present temperature of the conductor 2 and the processor 7 may, e.g., based on a measured or predefined TCR, adapt the reference resistance accordingly. The TCR may be stored in the memory 13. Generally, the temperature sensor 14 may be thermally coupled to the conductor 2 and configured to measure the temperature of the shunt portion 8 of the conductor 2. Generally, it is possible that such determining of the reference resistance of the conductor 2 is executed for a plurality of temperatures. For example, the temperature of the conductor may be monitored by the temperature sensor 14. Then, the reference resistance that is written to the memory 13 may include a temperature coefficient of resistivity (TCR) of the resistance of the conductor 2.

In such a scenario as illustrated in FIG. 1A, calibration of the system 100 by determining the reference resistance based on the test current is typically only required once prior to operation, e.g., after the sensor 11 has been connected to the sense contacts 4h, 4l. Then, during normal operation, it may be not required to provide the LIA 12. In other words, the LIA 12 may only be required during calibration. In this context, the force contacts 3h, 3l may be referred to as temporary contacts, because they are only used to inject the test current temporarily during calibration.

As part of the calibration, the test current is injected into the conductor 2. In the scenario of FIG. 1A, the test current is injected by means of the LIA 12. Generally, it is also possible that the sensor 11 comprises a current generator that is configured to generate and inject the test current (not shown in FIG. 1A).

It is then possible to measure the current through the primary conductor 2 in-between the sense contacts 4h, 4l along the effective shunt portion 8. In the scenario of FIG. 1A, during calibration, the voltage drop in between the sense contacts 4h, 4l is measured by an amplifier 12h of the LIA 12. Then, the ratio of the voltage over a magnitude of the test current is written to the memory 13 of the sensor 11. This may be in some encoded form, e.g., after some mathematical manipulations to map this value to a favorable format of the digital code (e.g., a value corresponding to:

$$\text{Truncate}[((VGT/MAG)/NOM - 0.5) * 1024] \quad \text{Equation 1}$$

may be written to the memory 13, where VGT is the measured voltage, MAG is the test current magnitude, NOM is a predefined number, and the deviation from 0.5 is scaled to a 10 bit word.)

During operation, the processor 7 of the sensor 11 retrieves this value as the reference resistance from the memory 13 to determine the primary current in the conductor 2 according to the formula:

$$I_{primary} = k1 * V_{sense}/(VGT/MAG) * (1 - TCR_{nom} * (T - T_{ref})) \quad \text{Equation 2}$$

Where k1 is a factor, Vsense is the voltage drop across the conductor 2 between the electrical contacts 4h, 4l due to the primary current, TCRnom is the nominal temperature coefficient of the conductor 2, T is the temperature measured by the temperature sensor 14 of the sensor 11 during operation, and Tref is the temperature during calibration with the test current. Generally, it may be desirable to also store the temperature Tref in the memory 13; however, this may be expendable if a fixed temperature is referred to For example, during calibration, it is possible to compute the temperature drift of the conductor 2 assuming a nominal TCR, e.g., a predefined TCR that is specific to a material of the conductor 2.

The factor k1 may be equal to 1 if the ratio of voltage drop between the sense contacts 4h, 4l over test current at vanishing primary current is equal to the ratio of voltage drop between the sense contacts 4h, 4l over primary current at vanishing test current. However, it is possible that a distance between each of the force contacts 3h, 3l and the respective one of the sense contacts 4h, 4l is comparably small, e.g., due to size limitations; then, the test current may be comparably inhomogeneously distributed in the shunt portion 8, e.g., if compared to the primary current. Such an inhomogenity of a spatial distribution of the test current may lead to a systematic difference in resistance for the test current and the primary current, which is accounted for by the factor k1. Moreover, if the frequency of the test current is significantly different from the frequency of the primary current the resistance for test current and primary current by be different due to eddy currents in the conductor 2, which again may be accounted for by the systematic factor k1. The factor k1 is determined either by a calculation, e.g. a numerical simulation of current flow, or empirically by laboratory investigation.

As mentioned above, it is generally possible that the test current is generated by the sensor 11 or by an external device, e.g. by the LIA 12. If the test current is generated by some external component/circuitry, a magnitude of the test current may be comparably large. In particular, if the magnitude of the test current is comparably large, it is possible to use a DC current. However, it may be possible only to a limited degree to inject large test currents, e.g., test currents that are larger than 1 A, via provisional force contacts 3h, 3l. Large test currents are also restricted if the force contacts 3h, 3l are not perfect due to wear, corrosion, inappropriate contact pressure, dirt, or oxidation on the surface of the force contacts 3h, 3l due to heating up which leads to thermo-offset errors. Sometimes, provisional force contacts 3h, 3l may be preferable, as they are typically only used once during the above-mentioned calibration to inject the test current into the conductor 2. In such cases as mentioned above, it may be advantageous to use a test current which comprises an AC component. In particular, the LIA 12 may be configured to provide the test current. Typically, the LIA 12 provides a sine-wave voltage generator that may be used to inject the test current into a series connection of the conductor 2 and a 50 Ohm calibration resistance 12R. At 5 V, one obtains a magnitude of the test current of 100 mA. The advantage of using an AC test current is that with phase sensitive detectors like the LIA 12 or spread spectrum techniques, it is possible to achieve stable readings where noise and interference from power line or other equipment is efficiently suppressed.

Then, during calibration, the sense terminals 6ih, 6il are connected to the inputs of the LIA 12 and the sensed voltage drop VTG is measured. If the LIA 12 taps the voltage at the same sense contacts 4h, 4l as the sensor 11 via the sense terminals 6ih, 6il, a high accuracy of current measurement may be achieved.

As may be seen from FIG. 1A, wiring connects the sense contacts 4h, 4l with the sense terminals 6ih, 6il of the sensor 11. The wiring may be prolonged to run also to the inputs of the LIA 12; it is also possible that the LIA 12 employs dedicated wiring as long as the wiring of the LIA 12 and the wiring of the sensor 11 both connect to the sense contacts 4h, 4l.

As mentioned above, it is possible that the primary current flows—in addition to the test current—in the conductor 2. In such a scenario, it may be required to separate contributions of the voltage drop due to the test current and the primary current. In other words, it may be required to determine a contribution to the voltage drop due to the test current further to a contribution to the voltage drop due to the primary current. If the contribution to the voltage drop due to the test current is determined, it is possible to determine the reference resistance of the conductor 2, as the test current is well-defined.

In the scenario of FIG. 1A, the contributions to the voltage drop due to the test current and the primary current are separated based on lock-in techniques implemented by the LIA 12. To this end, the primary current preferably has no or an negligible power spectrum within the effective bandwidth of the LIA 12. So if the LIA operates at, e.g., 10 kHz with an effective bandwidth of 100 mHz, then the primary current must not have too large power in the frequency band between 9999.9 Hz and 10000.1 Hz.

Other techniques of separating the contributions to the voltage drop are conceivable that may be applied additionally or alternatively. For example, in case the test current comprises an AC contribution, it may be possible to determine the contributions to the voltage drop due to the test current and due to the primary current based on a selection in frequency domain. In a simple scenario, if frequency components of the test current and the primary current are non-overlapping, the discrimination may be done by low-pass and/or high-pass filtering. For example, it may be possible to limit a measurement bandwidth for the primary current, e.g., to a value of 1 MHz. Then, it may be possible to choose a larger frequency for the test current, e.g., residing around 3 MHz. Such non-overlapping frequency bands allow discriminating the test current against the primary current. Thus, generally it is possible that the test current is injected into the conductor 2 having a predefined spectral distribution.

Generally, the separation of the contributions to the voltage drop due to the test current and the primary current in frequency domain may be based on at least one of a lock-in technique and a spread-spectrum technique that is sensitive to the spectral distribution of the test current. The spectral distribution of the test current may reside in a frequency band of 0 Hz to 1 MHz, preferably in a frequency of 100 kHz to 300 kHz.

Alternatively or additionally to such a separation of the contributions to the voltage drop due to the test current and the primary current in frequency domain, it is also possible to separate the contributions to the voltage drop due to the test current and the primary current in time domain. For example, it is possible to rely on time multiplexing. For example, the test current may be injected into the conductor whenever it is determined that the primary current does not flow. In a simple scenario, it may be possible to apply the test current in a dedicated calibration phase where it is ensured that the primary current does not flow, e.g., because it is manually switched off. However, it is also possible to monitor the primary current to detect time intervals where the amplitude of the primary current is zero. For example, such monitoring of the primary current may be done by means of a control signal received from a power switch by a respective interface of the sensor 11. If, for example, the primary current flows in intermitted time intervals, it is possible that the test current is selectively injected in corresponding, e.g., complementary intermitted, time intervals.

Hereinafter, various details with respect to a magnitude of the test current are provided. Generally, the magnitude of the test current may depend on an impedance of the primary conductor 2. For example, if the impedance of the primary conductor 2 is low, e.g., in the order of 1 mOhm to 100 µOhm, the voltage drop that is achievable across the effective shunt portion 8 is also comparably low, e.g., in the order of 10-20 mV at a full-scale test current. Considering a voltage drop having a magnitude of 10 mV at a test current having a magnitude of 100 A, this corresponds to a reference resistance of 100 µOhm and a dissipation of 1 W.

Generally, it may be desirable that the test current is dimensioned to be small in order to reduce power consumption. Supposing a scenario with an effective shunt portion 8 having a resistance of 100 µOhm where a test current of 1 A may be provided, a voltage drop between the sense contacts 4h, 4l of 100 µV is achieved. Such a voltage drop may be typically measured with an accuracy of 1%, i.e., an offset error in the order of 1 µV may be achieved with best-in-class voltmeters. While this may correspond to an acceptable accuracy, it is evident that comparably large test currents in the order of 1 A are required. While test currents of this magnitude may be acceptable during initial calibration after assembly of the system 100, they may not (or only to a limited degree) be acceptable during standard operation. Accordingly, the sensor 11 may be configured with a current generator (not shown in FIG. 1A) that employs an AC test current in combination with lock-in amplification or spread-spectrum techniques that provide a high sensitivity. Here, smaller magnitudes of the test current allow to achieve comparable accuracies. In particular, in such scenarios, accuracies of 1-10 nV are possible depending on the amount of electromagnetic disturbances and/or background noise that is, e.g., picked up via the wiring between the sense contacts 4h, 4l and the sense terminals 6ih, 6il.

Generally, when the test current comprises an AC contribution, it may be possible to dimension the test current two magnitudes smaller than a pure DC test current, which gives a magnitude of approximately 10 mA, instead of 1 A as explained above. An additional advantage of applying lock-in techniques is that comparably low effective bandwidths of the test current may be employed so that an influence of background noise is reduced.

When relying on test currents having a significant AC component, the skin effect should be taken into account. Namely, where it may be expected that the primary current in the conductor has contributions in the range of 100 kHz to 300 kHz, it may be desirable to apply the test current having components in the frequency band of 500 kHz to 1 MHz. In the scenarios where the primary conductor 2 is a bulk object, i.e., is massive, the test current typically may not fully penetrate into the conductor 2 due to the skin effect. Therefore, the highest amplitude of the test current will be on the surface of the conductor 2. This may lead to inaccuracies when determining the primary current.

In order to account for the skin effect, it is possible to rely on spread-spectrum techniques—rather than on lock-in techniques. Where lock-in techniques rely on single frequency components, i.e., pure sine waves, or integer multiples of single frequency components, i.e. periodic signals like pulse waves or similar signals that may be decomposed into a Fourier series, spread-spectrum techniques use stochastic or pseudo-random signals. In particular, here it is possible that the frequency contributions of the test current and the primary current overlap. Therefore, if the test current is injected employing a spread-spectrum technique, it is possible to use the same frequency band as the primary current, e.g., in the range of 0 Hz-1 MHz. The detector then may extract the contribution to the voltage drop due to the test current across the effective shunt portion 8 via a correlation between sampled values and the pseudo-random input pattern of the test current provided by the spread-spectrum technique. Here, as the test current covers the same frequency band as the primary current, the determining of the contribution to the voltage drop due to the test current does not suffer from frequency distortion between the test current and the primary current.

Generally, spread-spectrum techniques are well-known in communication engineering; in the framework of spread-spectrum techniques, the interference of the channel may be equated with the primary current and the data to be transmitted may be equated with the test current. Since the resistance of the effective shunt portion 8 does not change rapidly, e.g., changes on a time scale significantly longer than microseconds, e.g., on a timescale in the order of milliseconds or seconds, it is possible to apply a comparably powerful long pseudo-random code that may be used to modulate the test current. Powerful may relate to a scenario where the contribution to the voltage drop due to the test current may be recovered at a high accuracy in spite of the strong and fast changing primary current.

Generally, the particular form and shape of the conductor 2 may widely vary. For example, in FIG. 1A, the conductor 2 has the shape of a massive bus bar, i.e., a bulk conductor is shown. The conductor 2 may have a homogeneous cross-section or not. The conductor 2 may be elongated or not. The conductor 2 may be a bulk conductor or maybe sheet-like. The conductor 2 may comprise holes, stud-holes, recesses, profiles, etc. in its surface topology. The conductor 2 may be substantially one-dimensional such as a typical wire. It is also possible that the conductor 2 is two-dimensional, e.g., is formed by a layer. The conductor 2 may be three-dimensional, e.g., if the conductor 2 is clamped to the battery of a car.

Figure 1B:
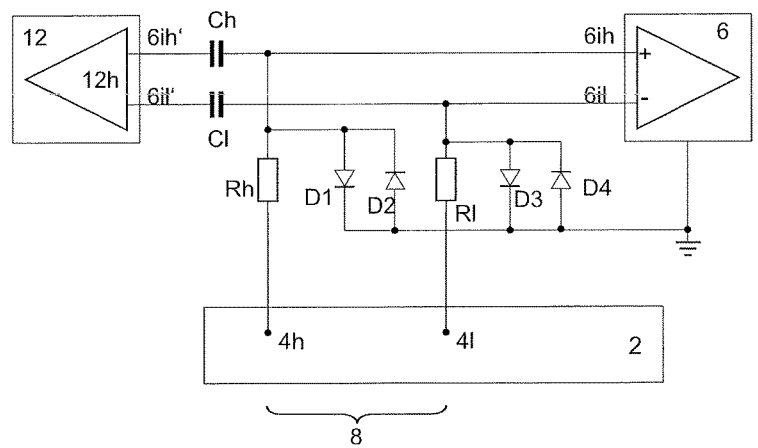
FIG. 1B illustrates an exemplary embodiment of FIG. 1A.

In FIG. 1B, a specific implementation of the system 100 as discussed above with respect to FIG. 1A is shown. Here, Rh, Rl are protection resistances, D1, D2, D3, D4 are protection diodes, and Ch, Cl are filter capacitors. These protection elements provide frequency filtering and suppress background noise and may limit current, e.g., in case of short-circuit fault. They increase safety against failure and, possibly, against electrostatic discharge.

As may be seen from FIGS. 1A and 1B, there is a first pair of sense terminals $6ih$, $6il$ and a second pair of sense terminals $6ih'$, $6il'$. Both are connected to the sense contacts $4h$, $4l$. The sense contacts $6ih'$, $6il'$ allow to connect, e.g., the LIA 12 to measure the voltage drop due to the test current.

Figure 2:
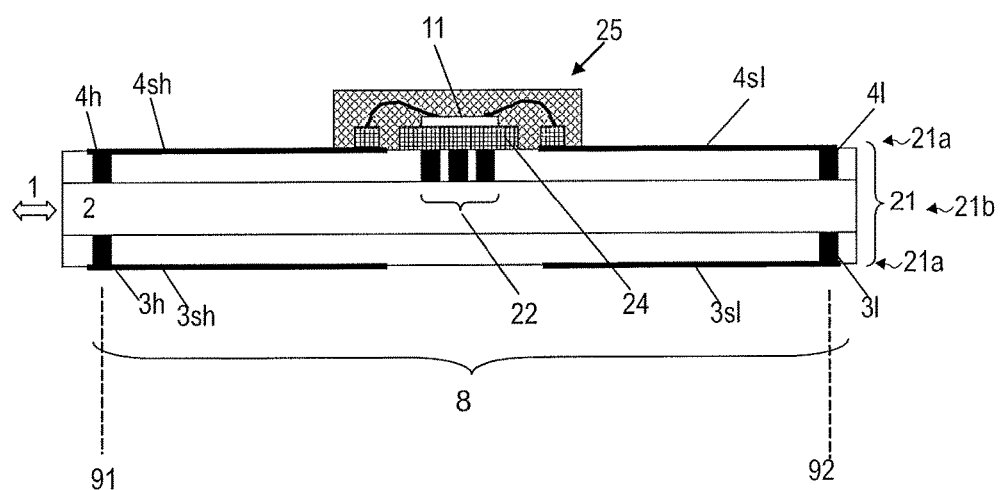
FIG. 2 is a cross-sectional view of a system according to one or more exemplary embodiments.

One specific design of the system 100 including the conductor 2 is shown in FIG. 2. In FIG. 2, the system 100 includes a contiguous primary conductor 2 arranged in the center of a substrate.

Here, the conductor 2 is buried inside a component board which comprises a thick core layer $21b$. In detail, the conductor 2 is formed by the center layer 21 of a substrate 21; the substrate 21 may implement power-circuit functionality. The conductor 2 is formed in a bulk material. Therefore, it may carry large primary currents 1. For example, the component board may be a power component board. On an outer surface of the component board, the sensor 11 is arranged inside the microelectronic package 25; e.g., the sensor 11 may be implemented by a semiconductor chip comprising voltage measurement device 6. The sensor 11 may be attached to the outer surface by a massive copper slug or die paddle 24. Thermal coupling 22 is provided in between the the paddle 24 and the center layer $21b$, e.g., by thermal vias through the top insulating layer of the substrate 21. Generally, the thermal coupling 22 may, at the same time, be an electrical coupling and thereby, e.g., implement wiring. It is also possible that the thermal coupling 22 is galvanically isolated, e.g., by providing thin insulating layers in-between electrical elements and the die paddle or the slug or in-between the slug and the chip that implements the sensor 11.

Wiring for $3sh$, $4sh$, $3sl$, $4sl$ in between the contacts $3h$, $3l$, $4h$, $4l$ comprises traces in surface conductive layers $21a$ of the substrate 21; the traces may also be part of a lead frame of the sensor package. The surface layers $21a$ have a thickness that is smaller than a thickness of the center layer $21b$. The surface layers $21a$ are separated by isolators from the center layer $21b$. The wiring $3sh$, $4sh$, $3sl$, $3sl$ is connected to the sensor via bondwires and the sense terminals $6ih$, $6il$ and force terminals $5i$, $5o$ (not shown in FIG. 2). Respective contacts pads may be provided.

Notably, in FIG. 2, the conductor 2 is not interrupted and the conductor 2 is not routed to the surfaces of the substrates 21. The techniques as described herein allow accurately determining the primary current 1 without causing an increase in power dissipation in the primary conductor 2 and without increasing the size of the system 100.

As may be seen from a comparison of FIGS. 1A and 2, an arrangement of the electrical contacts $3h$, $3l$, $4h$, $4l$ on the conductor 2 may widely vary. For example, in the scenario of FIG. 1A, the force contacts $3h$, $3l$ are arranged outside of the sense contacts $4h$, $4l$. Differently, in the scenario of FIG. 2, a distance between the force contacts $3h$, $3l$ and between the sense contacts $4h$, $4l$ is substantially equal. In other words, the first positions 91 of the first pair of contacts $3h$, $4h$ coincide; likewise, the second positions 92 of the second pair of contacts $3l$, $4l$ coincide. In further embodiments, the first pair of contacts $3h$, $4h$ and the second pair of contacts $3h$, $4l$ may be inter-digitated. It is also possible to place the force contacts $3h$, $3l$ in-between the sense contacts $4h$, $4l$. The sense contacts $4h$, $4l$ and the force contacts $3h$, $3l$ may be placed on the same or different surfaces of the bulk conductor 2.

In the scenario of FIG. 2, there is dedicated wiring $3sh$, $4sh$, $3sl$, $4sl$ coupling each one of the pair of force contacts $3h$, $3l$ and the pair of sense contacts $4h$, $3l$ with respective sense terminals $6ih$, $6il$ and force terminals $5i$, $5o$ of the sensor 11, respectively. However, it is also possible that the wiring $3sh$, $3sh$, $3sl$, $3sl$ comprises a common connector that couples at least one of the pair of sense contacts $4h$, $4l$ and at least one of the pair of force contacts $3h$, $3l$ with the respective terminals $5i$, $5o$, $6ih$, $6il$. Providing a common connector may reduce a need for building space. It may enable microintegration. On the other hand, accuracy may be reduced if compared to a scenario as illustrated in FIG. 2 where completely separate wiring for the force contacts $3h$, $3l$ and the sense contacts $4h$, $4l$ exists. A reduced accuracy may in particular occur in a scenario where the resistance of the effective shunt portion 8 of the conductor 2 is comparably small and where a resistance of the common connector is higher; in such a scenario, the voltage drop due to the test current may be dominated by the resistance of the common connector, which means that the sensed input signal is only partly due to the effective shunt portion 8.

Figure 3:
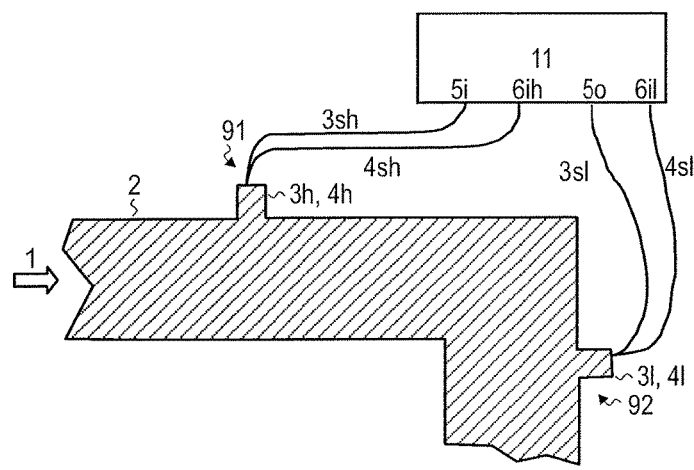
FIG. 3 illustrates a schematic diagram of a primary conductor and a pair of electrical contacts that are connected to a pair of sense terminals and a pair of force terminals according to one or more exemplary embodiments.

FIG. 3 schematically illustrates the wiring 3*sh*, 4*sh*, 3*sl*, 4*sl* and the contacts 3*h*, 3*l*, 4*h*, 4*l* according to one or more exemplary embodiments. In the scenario of FIG. 3, the first contact 3*h*, 4*h* is formed by a first protrusion of the conductor 2; the second contact 3*l*, 4*l* is formed by a second protrusion of the conductor 2. As may be seen, in the scenario of FIG. 3, the sense contacts 4*h*, 4*l* and the force contacts 3*h*, 3*l* are formed at the same positions 91, 92 on the surface of the conductor 2. In particular, if compared to the scenario of FIG. 1A where the force contacts 3*h*, 3*l* and the sense contacts 4*h*, 4*l* are placed on different faces of the bulk conductor 2, in the scenario of FIG. 3, both, the force contacts 3*h*, 3*l* as well as the sense contacts 4*h*, 4*l* are placed on the same faces of the conductor 2. Generally, the positioning of the contacts 3*h*, 3*l*, 4*h*, 4*l* on the faces of the conductor 2 may vary.

Thermo offsets that are typically caused by small voltages in the µV range that are due to different Seebeck-coefficients of the conductor 2 and the wiring 3*sh*, 4*sh*, 3*sl*, 4*sl* should be avoided. In particular, such thermo offset may occur in a scenario where the temperature of the sense contacts 4*h*, 4*l* differs from each other. This may happen during operation of the power circuit, i.e., in a scenario where the primary current 1 flows through the conductor 2 and causes (local) heating. In a scenario where the test current comprises an AC component or is pseudo-random, thermo offsets are irrelevant for the contribution to the voltage drop due to the test current—yet it may be still relevant for the voltage drop due to the primary current 1. However, where a DC-component of the test current is used to determine the contribution to the voltage drop due to the test current, thermo offsets may occur and reduce an accuracy in determining at least one of the reference resistance and the primary current 1.

According to one or more exemplary embodiments, it is possible to provide the wiring 3*sh*, 4*sh*, 3*sl*, 4*sl* made substantially of the same material as the conductor 2. For example, the conductor 2 and substantial parts of the wiring may be made out of copper. The wiring 3*sh*, 4*sh*, 3*sl*, 4*sl* being made substantially of the same material as the conductor 2 may refer to a scenario where resulting thermos offsets due to different Seebeck-coefficients during operation of the system 100 remain below a certain threshold. In particular, the resulting thermo offsets may be so small that reducing offset voltages do not significantly influence the measurement of the primary current 1.

Alternatively or additionally to such a suppression of the thermo offset based on a homogeneous choice of materials, it is also possible to reduce a spacing between the first and second positions 91, 91-1, 91-2, 92, 92-1, 92-2. Namely, if the spacing between the first and second positions 91, 91-1, 91-2, 92, 92-1, 92-2 is small, a temperature difference between the two sense contacts 4*h*, 4*l* is also expected to be small. Generally, it may be required to optimize the spacing between the first and second positions 91, 91-1, 91-2, 92, 92-1, 92-2 with respect to, both, small temperature differences, as well as a sufficiently large resistance across the effective shunt portion 8. Namely, if the resistance of the effective shunt portion 8 is too small, determining of the voltage drop across the conductor 2 may become inaccurate. For example, the distance between the first and second positions 91, 91-1, 91-2, 92, 92-1, 92-2 should be large enough so that the resistance of the effective shunt portion 8 is larger than 10 µOhm, corresponding to a voltage drop of 1 mV at a current of 100 A. In such a case, achieving an accuracy of 1% is difficult as this would relate to measuring a voltage drop of 10 nV. Therefore, it may be desirable to increase the spacing between the first and second positions 91, 91-1, 91-2, 92, 92-1, 92-2, e.g., to larger than 10 mm. Then, the wiring 3*sh*, 4*sh*, 3*sl*, 4*sl* may also be of considerable length. It may also be required to provide a sensor 11 with a pre-amplifier or the like. Further, it may be desirable to position the sense terminals 6*ih*, 6*il* close to each other in order to ensure that the two sense terminals 6*ih*, 6*il* are at the same temperature. This is all the more important since the wires 4*sh*, 4*sl* may have different Seebeck coefficients, because they may be made at least partly of different material, e.g. copper, as the sense terminals 6*ih*, 6*il*, e.g. aluminum as used for bond wires or as on-chip interconnect lines. It may also be favorable to add homogenization elements that smooth temperature gradients between the two sense terminals 6*ih*, 6*il*. This may be possible by grinding the semiconductor die 24 thin and attach it to a massive copper slug; alternatively or additionally, it may be possible to add metal layers stretching between the two sense contacts 4*h*, 4*l*.

As mentioned above, to obtain a sufficiently large resistance across the effective shunt portion 8, the distance between the sense contacts 4*h*, 4*l* should be dimensioned to be sufficiently large (cf. FIG. 2). On the other hand, a large distance between the sense contacts 4*h*, 4*l* allows for large temperature gradients, thereby increasing the likelihood of encountering thermo offsets. This may be achieved by forming the wiring 4*sh*, 4*sl*, e.g., the traces of FIG., from the same material as the conductor 2. Then, different materials are only in contact with each other within the microelectronic package 25, e.g., in the scenario of FIG. 2 at the end of traces 4*sh*, 4*sl* where the bond wires attach. However, here a distance in-between the different materials is small and, therefore, large temperature gradient are not expected; a resulting thermo offset is small. Thus, generally, the conductor 2 and the wiring 3*sh*, 3*sl*, 4*sh*, 4*sl* may be made from the same material, in particular where the conductor 2 is formed by the center layer 21*b* of the substrate 21 and where the wiring 3*sh*, 3*sl*, 4*sh*, 4*sl* is formed by traces in the conductive layers 21*a* of the substrate 21.

Above, techniques have been illustrated where, e.g., during an initial calibration phase, the LIA 12 is connected to the system 100 to determine the voltage drop across the effective shunt portion 8 due to the test current. For this purpose, the force contacts 3*h*, 3*l* and the sense terminals 6*ih*, 6*il* need to be contactable from the outside.

Figure 4:
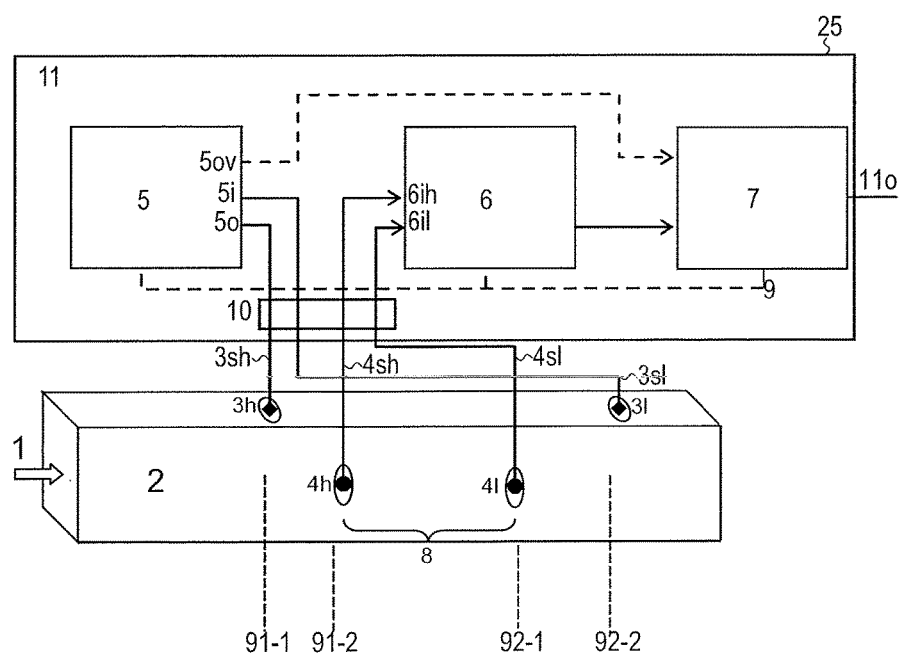
FIG. 4 illustrates a schematic diagram of a device according to one or more exemplary embodiments.

It is also possible that the device 11 comprises a current generator 5 that generates the test current (see e.g., FIG. 4). In particular, FIG. 4 illustrates device 11 with a current generator 5 for injecting a test current into the primary conductor via a pair of force terminals 5*i*, 5*o*, a pair of sense terminals 6*ih*, 6*il*, and a processor 7. The test current may be generated during the measurement such that a preceding calibration phase may not be required. Here, an accuracy of the determining of the primary current may be particularly high. The current source 5, the voltage measurement device 6, and the processor 7 may be synchronized in time domain via control signaling 9. This may allow separation of the primary current 1 and the test current in time domain. Further, the current source 5 may optionally provide the value of the test current to the processor 7 via control signaling (indicated by the dashed line in FIG. 4 and the interface 5*ov*); this may not be required if the test current is generated by the current source 5 having a predefined and known strength. The device 11 of FIG. 4 may include an optional protection circuit 10.

Figure 5:
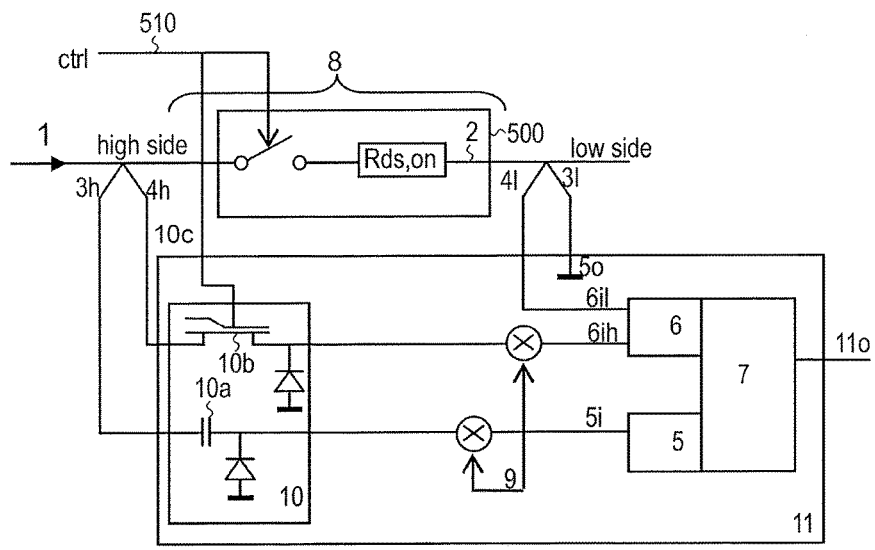
FIG. 5 illustrates a schematic diagram of a device according to one or more exemplary embodiments.

The optional protection circuit 10 is explained in greater detail referring to FIG. 5. The primary conductor 2, particularly in the region of the effective shunt portion 8, may be a simple part of a thick conductor trace or a bus bar, e.g., as explained above. However, the conductor 2 may generally also comprise other resistive elements like the Rds,on-resistance of a transistor 500, e.g., a power transistor. The resistance of the resistor Rds,on does not necessarily have to be known very precisely, nor does it have to be very stable over temperature or lifetime, since it may be calibrated continuously with the test current. Usually the Rds,on-resistance is larger than the voltage drop over metallic conductors or bus bars. Therefore the sensed voltage is larger if the effective shunt portion 8 comprises the Rds,on-resistance. The Rds,on-resistance is controlled by a control signal 510.

If the transistor 500 is off during some periods of time, precautions have to be taken not to harm the sensor 11 due to the resulting large voltages, e.g., during transients of the primary current. Where the transistor 500 is off, a comparably large difference between high-side and low-side voltage levels may result—because the low side is close to reference potentials while the high side may be at potentials near 1 kV.

To address this, the protection circuit 10 may be provided, e.g., at the high-side of the conductor 2. The protection circuit 10 may be purely resistive, resistively clamped, inductive, and/or capacitive. In the latter two cases, there is no galvanic coupling between the high-side force/sense terminals 5i, 6ih of the sensor 11 and the conductor 2 which is particularly advantageous.

The above FIGS. 4 and 5 show the system 100 where the current generator 5 is integrated into the sensor 11. The current generator 5 generates the test current having a certain time variation based on the control signal 9 (indicated in FIG. 5 by the multiplication-sign referring to modulation in the broadest possible sense). Time variation may occur, e.g., on a single carrier frequency as in lock-in techniques or on a broad frequency band as in spread-spectrum techniques.

Upon generating the test current, the test current flows over the protection circuit 10 which is a clamped capacitor 10a (i.e., coupled to a clamping diode) in the embodiment illustrated in FIG. 5. The clamped capacitor 10a does not significantly alter the AC test current. The clamped capacitor 10a protects the sensor 11 from voltage peaks coupled from potential jumps or transients at the high-side to the sensor 11. Then the test current is injected into the conductor 2, i.e., at the high-side of the effective shunt portion like 8. The return path of the test current at the low side is not protected by a protection circuit. If large potential jumps or transients occur also at the low side, a similar protection circuit may be provided at the low side signal path.

Instead of capacitive coupling one may also use inductive coupling. This could be done by two coils, e.g., made from copper or aluminum wires, in close proximity. For example, two planar coils integrated on the surface of a semiconductor chip and separated by a dielectric layer that withstands several kV voltage may be used. It is also possible to add some permeable magnetic materials to enhance the coupling of the two coils, e.g., some material with large relative permeability, around which the coils are wound.

The high-side sense terminal 6il of the sensor 11 is also protected by means of the protection circuit 10. Yet, here a high-voltage Metal Oxide Semiconductor (MOS)-transistor 10b is employed, because the protection circuit 10 should also pass low-frequency and DC-potentials at the high side to the sensor 11 connected to the sense terminal 6ih. The MOS-transistor 10b may be off whenever the power-switch 500 is off, because then the large voltage builds up at the high side and no significant currents flow. When the power-switch 500 is switched on, the primary current 2 starts to flow and the potential at the high side is only several mV larger than on the low side. Then the high-voltage MOS-transistor 10b conducts the potential from the high-side of the effective shunt portion 8 to the voltage measurement device 6.

Instead of or in series to the high-voltage MOS-transistor 10b, a resistor may be connected between the nodes where source and drain of 10b is connected in FIG. 5 (not shown in FIG. 5). If the power switch 500 is off and the high side potential goes up to, e.g., 1 kV, depending on the load connected to the conductor 2, the resistor increases the voltage level at its sensor-input side, yet the diode clamps it, thereby protecting the sensor 11 from damage.

It is noted that the control signal 510 originates at a control entity of the power switch. The sensor 11 employs the control signal 510 or a derived signal to control the protection-HV-MOS 10b. It may be advantageous if a non-overlap signal is generated which switches off the high-voltage MOS-transistor 10b some time, e.g., nanoseconds, before the power-switch 500 is switched off and switches on the high-voltage MOS-transistor 10b some time after, e.g., nano-seconds, the power-switch 500 is switched on. This avoids excessive voltage transients on the sensor 11. Thus, the protection circuit 10 may be prospectively operated to protect the sensor 11. In this respect, the sensor 11 comprises the control interface 10c that receives the control signal 510 indicating a current transient of the primary current 1, e.g., due to switching of the power switch 500. Then, the pair of sense terminals 6ih, 6il may be configured to selectively provide the input signal depending on the received control signal 510. This may occur by a control of the high-voltage MOS-transistor 10b; in particular, such a control may be implemented prospectively.

As may be seen, various variations to the protection circuit 10 are conceivable. Generally, although reference has been made to high-side and low-side of the conductor 2, they may also be swapped. If the primary current 1 is an AC current, there is no high- and low-side potential or it is also alternating. Even at DC where there is no power-switch 500 present, the potential between high-side and low-side is on the order of mV only; therefore it is usually no problem for the sensor 11 circuit to inter-change both contacts.

Above, it has been illustrated how the control signal 510 may be employed to operate the protection circuit 10. The control signal 510 may alternatively or additionally also be employed for separating the test current and the primary current 2. The sensor 11 may employ the control signal 510 to compute whether the current measurement is active or not (in the latter case the HV-MOS is off).

Now referring again to FIG. 4, the current generator 5 generates the test current. It is not required to provide an external current source or the like, e.g., the LIA 12. Generally, the current generator 5 may be implemented in different ways according to one or more exemplary embodiments as explained hereinafter with respect to FIGS. 6A-6C.

Figure 6A:
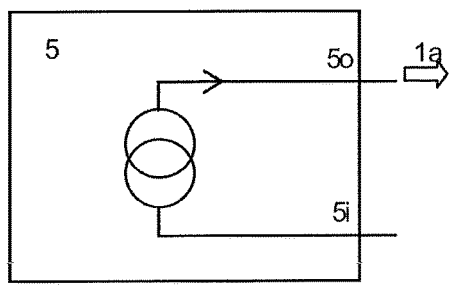
FIG. 6A illustrates a schematic diagram of a current generator according to one or more exemplary embodiments.
Figure 6B:
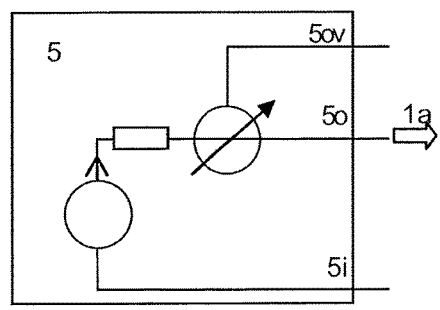
FIG. 6B illustrates a schematic diagram of a current generator according to one or more exemplary embodiments.
Figure 6C:
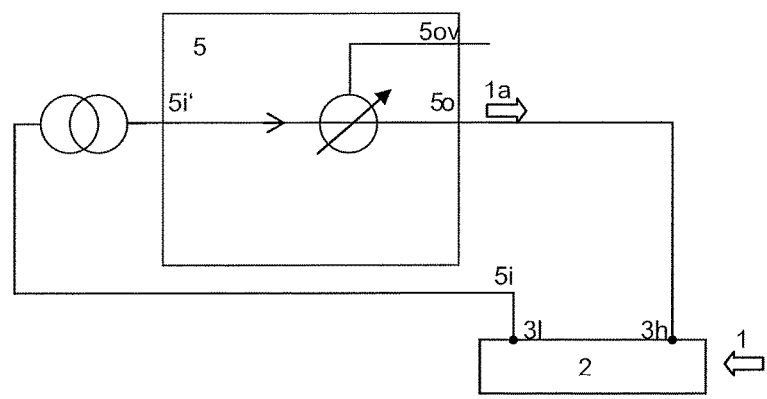
FIG. 6C illustrates a schematic diagram of a current generator according to one or more exemplary embodiments.

FIG. 6A schematically illustrates a current generator 5 that includes a current source. FIG. 6B schematically illustrates a current generator 5 that includes a voltage source and a resistor in series, as well as an amperemeter. FIG. 6C schematically illustrates a current generator 5 that includes an amperemeter to measure an unknown current injected into its input terminal and provided at its output terminal.

In FIG. 6A, a current source generates the test current 1a having a well-defined magnitude, etc. This value may be programmed into the processor 7. The interface 5ov may not be required.

It is also possible to provide the test current 1a with some variations and not in a well-defined manner. This may be the case if a current source of unknown strength is employed or a voltage source is employed (cf. FIG. 6B). The internal resistance of the voltage source is illustrated in FIG. 6B. For example, the test current 1a may be generated conveniently on-chip by copying a voltage across a resistor: if one or both of voltage and the resistor are poorly defined, e.g., due to temperature drift, lifetime drift, mechanical stress related drift due to piezo-effects, or simply because the voltage is applied from an externally connected device, then also the test current 1a is not well defined. In such scenarios, the sensor 11 may measure the test current 1a independently of its generation via an amperemeter-circuit. The corresponding value is provided from the current generator 5 via terminal 5ov to the processor 7.

Scenarios are conceivable where no current source is included in the sensor 11. Then, the pre-generated test current is injected via the force terminal 5o into the conductor 2 (cf. FIG. 6C). Here, the test current is input into the current generator 5 at terminal 5i', flows over an amperemeter-circuit that measures the test current 1a, and then it is output from current generator 5, whereby the value of the measured test current 1a is also provided via interface 5ov to the processor 7.

Above, various scenarios have been illustrated where the sensor 11 is attached to the conductor 2. Generally, the effective shunt portion 8 of the conductor 2 does not need to be integral part of the sensor 11. This is because the sensor 11 may be a device-in-a-package comprising the microelectronic package 25. The microelectronic package 25 may be a plastic encapsulated package, a ceramic package, a laminate or flip-chip package, a leaded package, a surface mounted device package, or a leadless package as generally known from prior art electronic devices such as discrete transistors, or operational amplifiers, or clock-generators, or micro-processors, etc. The microelectronic package 25 may have a longest dimension of less than 10 cm, preferably of less than 1 cm.

In particular, providing the sensor 11 separate from the conductor 2 may have the advantage of not having to provide a dedicated shunt; the conductor 2 may be left uninterrupted. However, it is also possible to provide a dedicated shunt as the conductor 2 being an integral part of the package of the sensor 11 (see e.g., FIG. 7. which illustrates the sensor implemented on a chip that is attached to a shunt). Here, the conductor 2 is implemented as a part of a lead frame. The conductor 2 may be made from a Cu-based alloy. It may have a thickness of approximately 0.2 mm.

Figure 7:
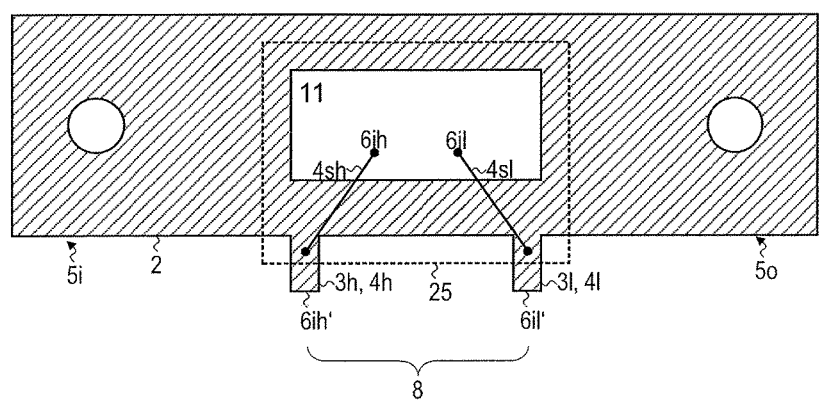
FIG. 7 illustrates a device having a microelectronic package housing a sensor according to one or more exemplary embodiments.

Notably, in FIG. 7 the sense terminals 6ih', 6il' are accessible from outside the microelectronic package 25 of the sensor 11; this allows connecting, e.g., the LIA 12 to the sense terminals 6ih', 6il' during calibration. Namely, as mentioned above, the test current 1a needs to be calibrated, e.g., during post-package-assembly test, or during final test at the semiconductor manufacturer or packaging subcontractor. Here, the amplitude and optionally other parameters of the test current 1a are determined.

Figure 8:
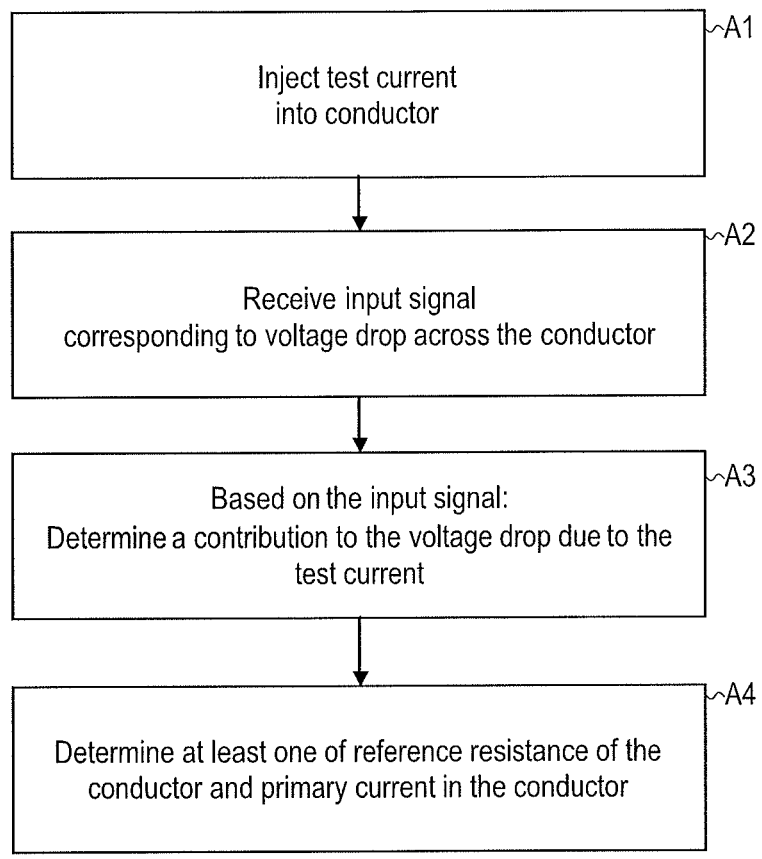
FIG. 8 illustrates a flowchart of a method according to one or more exemplary embodiments.

FIG. 8 illustrates a flowchart of a method according to one or more exemplary embodiments. The method may start at a point in time where the sensor 11 has been mounted on the substrate 21, as explained above, or installed in its application in the general case (e.g., a sensor of FIG. 7 is bolted to a busbar). Generally, at this point, the reference resistance of the effective shunt portion 8 of the conductor 2 is unknown, e.g., due to variations in the material composition or impurity of the material, variations in the texture or crystal structure, and/or variations in the thickness and the lateral dimensions. The test current 1a is injected via the force contacts 3h, 3l (A1) and the associated voltage drop between the sense contacts 4h, 4l is measured (A2). Based on known properties of the test current 1a, a contribution to the voltage drop due to the test current 1a is determined (A3). Here, a separation of contributions stemming from the primary current 1 and the test current 1a to the overall voltage drop may be made. Then, the reference resistance of the conductor 2 and/or the primary current 1 is derived (A4). A1-A4 may be executed in a calibration phase prior to execution of the measurement of the primary current 1.

Figure 9:
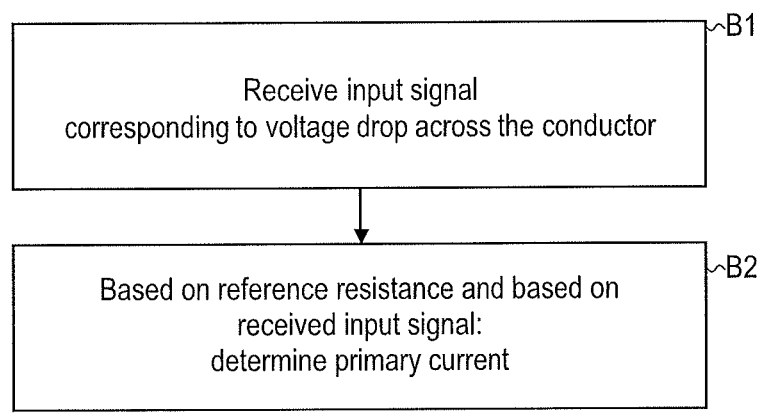
FIG. 9 illustrates a flowchart of a method according to one or more exemplary embodiments.

FIG. 9 illustrates a flowchart of a method according to one or more exemplary embodiments. In particular, a measurement of the primary current is illustrated in the flowchart of FIG. 9. The voltage drop between the sense contacts 4h, 4l is measured (B1); as no test current 1a needs to be applied, the voltage drop is due to the primary current 1, only. Then, the primary current 1 is determined based on the voltage drop and based on the reference resistance (B2). Here, optionally a compensation of the temperature drift may be executed where, based on a TCR and a temperature of the conductor 2 during calibration, the reference resistance is adapted.

Summarizing, above techniques have been explained that allow to accurately determine the primary current. In one or more exemplary embodiments, the primary current may be derived by considering a reference resistance that is predetermined by considering the test current in a calibration phase. In other embodiments, it is also possible to consider the test current during the measurement of the primary current. By such techniques it is possible to accurately consider the resistivity of the conductor, the cross section of conductor, and/or on the spacing of sense contacts, i.e., the length of the effective shunt portion 8. Typically, all such parameters are subject to process and manufacturing spread: they vary from lot to lot and from device to device. This spread is characterized by the single value of reference resistance, which is likely to be different from part to part reflecting the part-to-part spread of these parameters. Thus, by the techniques as mentioned above, it is possible to accurately account for such manufacturing spreads and precisely determine the primary current.

Although the exemplary embodiments have been shown and described, this disclosure is not limited to such, and include equivalents and modifications that are apparent to others skilled in the art upon the reading and understanding of the specification.

Additional exemplary embodiments are provided below.
Embodiments:
1. A system (100), comprising:
   a conductor (2),
   at least one first electrical contact (3h, 4h) coupled to the conductor (2) at a first position (91, 91-1, 91-2),
   at least one second electrical contact (3l, 4l) coupled to the conductor (2) at a second position (92, 92-1, 92-2), the first position (91, 91-1, 91-2) and the second position (92, 92-1, 92-2) being arranged at a distance with respect to each other,
   a pair of force terminals (5i, 5o) configured to inject, via the at least one first electrical contact (3h, 4h) and the at least one second electrical contact (3*l*, 4*l*), a test current (1*a*) into the conductor (2),
a device (11), comprising:
a microelectronic package (25),
a memory (13) configured to store a predefined reference resistance associated with the conductor (2),
a pair of sense terminals (6*ih*, 6*il*, 6*ih*', 6*il*') configured to provide an input signal related to a voltage drop across the conductor (2) between the at least one first electrical contact (3*h*, 4*h*) and the at least one second electrical contact (3*l*, 4*l*),
wherein the pair of sense terminals (6*ih*, 6*il*, 6*ih*', 6*il*') is at least partly accessible from outside the microelectronic package (25),
at least one processor (7) configured to determine a primary current (1) through the conductor (2) based on the input signal and the predefined reference resistance.

2. The system (100) of embodiment 1, further comprising: wiring (3*sh*, 4*sh*, 3*sl*, 4*sl*) coupling a first one of the pair of sense terminals (6*ih*, 6*il*, 6*ih*', 6*il*') and a first one of the pair of force terminals (5*i*, 5*o*) with the at least one first electrical contact (3*h*, 4*h*) and further coupling a second one of the pair of sense terminals (6*ih*, 6*il*, 6*ih*', 6*il*') and a second one of the pair of force terminals (5*i*, 5*o*) with the at least one second electrical contact (3*l*, 4*l*).

3. The system (100) of embodiment 2,
wherein the system (100) comprises a plurality of first electrical contacts (3*h*, 4*h*) and a plurality of second electrical contacts (3*l*, 4*l*),
wherein the wiring (3*sh*, 4*sh*, 3*sl*, 4*sl*) couples a first one of the plurality of first electrical contacts (3*h*, 4*h*) with a first one of the pair of sense terminals (6*ih*, 6*il*, 6*ih*', 6*il*'),
wherein the wiring (3*sh*, 4*sh*, 3*sl*, 4*sl*) couples a first one of the plurality of second electrical contacts (3*l*, 4*l*) with a second one of the pair of sense terminals (6*ih*, 6*il*, 6*ih*', 6*il*'),
wherein the wiring (3*sh*, 4*sh*, 3*sl*, 4*sl*) couples a second one of the plurality of first electrical contacts (3*h*, 4*h*) with a first one of the pair of force terminals (5*i*, 5*o*),
wherein the wiring (3*sh*, 4*sh*, 3*sl*, 4*sl*) couples a second one of the plurality of second electrical contacts (3*l*, 4*l*) with a second one of the pair of force terminals (5*i*, 5*o*).

4. The system (100) of embodiments 2 or 3,
wherein the wiring (3*sh*, 4*sh*, 3*sl*, 4*sl*) comprises a common connector coupling a first one of the pair of sense terminals (6*ih*, 6*il*, 6*ih*', 6*il*') and a first one of the pair of force terminals (5*i*, 5*o*) with the at least one first electrical contact (3*h*, 4*h*).

5. The system (100) of any one of embodiments 2-4,
wherein the wiring (3*sh*, 4*sh*, 3*sl*, 4*sl*) and the conductor (2) are substantially made of the same material.

6. The system (100) of any one of the preceding embodiments,
wherein the system (100) further comprises a substrate (21) having a first conductive layer (21*a*) and a second conductive layer (21*b*), the second conductive layer (21*b*) contiguously forming the conductor (2) in-between the first position (91, 91-1, 91-2) and the second position (92, 92-1, 92-2).

7. The system (100) of embodiment 6 and any one of embodiments 2-5,
wherein the first conductive layer (21*a*) has a first thickness and wherein the second conductive layer (21*b*) has a second thickness, wherein the first thickness is smaller than the second thickness,
wherein the wiring (3*sh*, 4*sh*, 3*sl*, 4*sl*) comprises traces in the first conductive layer (21*a*).

8. The system (100) of embodiments 6 or 7,
wherein the microelectronic package (25) is attached to an outer surface (21-1) of the substrate (21) adjacent to the second conductive layer (21*b*).

9. The system (100) of embodiment 8,
wherein the substrate (21) further comprises a thermal coupling (22) between the second conductive layer (21*b*) forming the conductor (2) and the outer surface (21-1).

10. The system (100) of any one of the preceding embodiments,
wherein the pair of force terminals (5*i*, 5*o*) is configured to inject the test current (1*a*) having an amplitude in the range of 1 mA-1 A, preferably in the range of 5 mA-100 mA, more preferably of approximately 10 mA.

11. The system (100) of any one of the preceding embodiments,
wherein the pair of force terminals (5*i*, 5*o*) is accessible from outside the microelectronic package (25).

12. A device (11), comprising:
a microelectronic package (25),
a pair of sense terminals (6*ih*, 6*il*, 6*ih*', 6*il*') configured to provide an input signal related to a voltage drop across the conductor (2),
at least one processor (7) configured to determine, based on a test current (1*a*) in the conductor (2) and based on the input signal, a contribution to the voltage drop due to the test current (1*a*), to determine a contribution to the voltage drop due to a primary current (1) through the conductor (2), and to determine the primary current (1).

13. The device (11) of embodiment 12, further comprising:
a pair of force terminals (5*i*, 5*o*) configured to inject the test current (1*a*) into the conductor (2).

14. The system (100) of any one of embodiment 1-11 or the device (11) of embodiments 12 or 13,
wherein the device (11) further comprises:
a temperature sensor (14) configured to measure a temperature signal indicative of a temperature,
wherein the at least one processor (7) is configured to determine the primary current (1) further based on the temperature signal.

15. The system (100) of embodiment 14 or the device (11) of embodiment 14,
wherein the temperature sensor (14) is arranged in the microelectronic package (25) such that a sensitive region of the temperature sensor (14) is thermally coupled with the exterior of the microelectronic package (25).

16. The system (100) of any one of embodiments 1-11 and 14-15 or the device (11) of any one of embodiments 12-15,
wherein the device (11) further comprises:
a control interface (10*c*) configured to receive a control signal indicating a current transient of the primary current (1),
wherein the pair of sense terminals (6*ih*, 6*il*, 6*ih*', 6*il*') is configured to selectively provide the input signal depending on the received control signal.

17. The system (100) of embodiment 16 or the device (11) of embodiment 16,
wherein the device (11) further comprises a protection circuit (10) configured to prospectively suppress a transient of the input signal based on the received control signal and comprising at least one of a series-connected capacitor, a galvanically isolated inductive coupling, a series-connected resistor, and a clamping diode.

18. The system (100) of any one of embodiments 1-11 and 14-17 or the device (11) of any one of embodiments 12-17, further comprising:
  a current source (5) coupled to the pair of force terminals (5i, 5o) and configured to generate the test current (1a).

19. A method, comprising:
  injecting, via a pair of force terminals (5i, 5o), a test current (1a) into a conductor (2),
  receiving, via a pair of sense terminals (6ih, 6il, 6ih', 6il'), an input signal related to a voltage drop across the conductor (2),
  determining, based on the test current (1a) and further based on the input signal, a contribution to the voltage drop due to the test current (1a),
  determining a contribution to the voltage drop due to a primary current (1),
  determining at least one of a reference resistance of the conductor (2) and the primary current (1).

20. The method of embodiment 19,
  wherein said determining of the at least one of the reference resistance of the conductor (2) and the primary current (1) is executed at a plurality of temperatures,
  wherein the determined reference resistance includes a temperature coefficient of resistivity.

21. The method of embodiments 19 or 20, further comprising:
  writing, to a memory (13), the reference resistance of the conductor (2).

22. The method of any one of embodiments 19-21,
  wherein the test current (1a) is injected into the conductor (2) having a spectral distribution,
  wherein said determining of the contribution to the voltage drop due to the test current (1a) is based on at least one of a lock-in technique and a spread-spectrum technique sensitive to the spectral distribution of the test current (1a).

23. The method of embodiment 22,
  wherein the spectral distribution resides in a frequency band of 0 Hz-1 MHz, preferably in a frequency band of 100 kHz-300 kHz.

24. The method of any one of embodiments 19-23,
  wherein the test current (1a) is selectively injected into the conductor (2) in intermitted time intervals.

25. The method of any one of embodiments 19-24,
  wherein the test current (1a) comprises an Alternating Current.

26. The method of any one of embodiments 19-25,
  wherein the test current (1a) has an amplitude in the range of 1 mA-1 A, preferably in the range of 5 mA-100 mA, more preferably of approximately 10 mA.

27. The method of any one of embodiments 19-26,
  wherein the test current (1a) is injected into the conductor (2) via at least one first electrical contact (3h, 4h) coupled to the conductor (2) at a first position (91, 91-1, 91-2) and via at least one second electrical contact (3l, 4l) coupled to the conductor (2) at a second position (92, 92-1, 92-2), the first position (91, 91-1, 91-2) and the second position (92, 92-1, 92-2) being arranged at a distance with respect to each other, wherein the input signal corresponds to the voltage drop across the conductor (2) between the at least one first position (91, 91-1, 91-2) and the at least one second position (92, 92-1, 92-2).

28. The method of any one of embodiments 19-27, wherein the method is executed by the device (11) of any one of embodiments 12-18 or the system (100) of any one of embodiments 1-11 and 14-18.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system, comprising:
  a conductor;
  a lock-in-amplifier (LIA) configured to generate a test current
  a first force contact coupled to the conductor at a first position;
  a second force contact coupled to the conductor at a second position, the first position and the second position being arranged at a first distance with respect to each other;
  a pair of force terminals coupled to the first force contact and the second force contact, the pair of force terminals configured to inject the test current from the LIA into the conductor across the first distance;
  a first sense contact coupled to the conductor at a third position;
  a second sense contact coupled to the conductor at a fourth position, the third position and the fourth position being arranged at a second distance with respect to each another and located within the first distance;
  a device, comprising:
    a microelectronic package;
    a memory configured to store a predefined reference resistance associated with the conductor;
    a pair of sense terminals coupled to the first sense contact and the second sense contact configured to provide an input signal related to a voltage drop across the conductor between the first sense contact and the second sense contact, wherein the pair of sense terminals is at least partly accessible from outside the microelectronic package; and
    at least one processor configured to determine a primary current through the conductor based on the input signal and the predefined reference resistance; and
  a first wiring coupling a first one of the pair of sense terminals with the first sense contact, wherein the first wiring includes a first connector to the LIA; and
  a second wiring coupling a second one of the pair of sense terminals with the second sense contact, wherein the second wiring comprises a second connector to the LIA, and
  wherein the LIA is configured to receive the input signal from the pair of sense terminals via the first wiring and the second wiring.

2. The system of claim 1, further comprising:
  a third wiring coupling a first one of the pair of force terminals with the first force contact; and
  a fourth wiring coupling a second one of the pair of force terminals with the second force contact.

3. The system of claim 1, further comprising a substrate having a first conductive layer and a second conductive layer, the second conductive layer contiguously forming the conductor between the first position and the second position.

4. The system of claim 3, wherein the microelectronic package is attached to an outer surface of the substrate adjacent to the second conductive layer, and the substrate further comprises a thermal coupling between the second conductive layer forming the conductor and the outer surface.

5. The system of claim 1, wherein the LIA is configured to determine the voltage drop between the pair of sense terminals from the input signal.

6. The system of claim 5, wherein the LIA is configured to determine a ratio of the voltage drop over a magnitude of the test current, and write the determined ratio into the memory as the predefined reference resistance.

7. The system of claim 1, wherein the LIA is configured to receive the input signal from the pair of sense terminals, and determine a contribution to the voltage drop due to the test current via a lock-in technique, determine a ratio of the contribution over a magnitude of the test current, and write the determined ratio into the memory as the predefined reference resistance.

8. A device, comprising:
a microelectronic package;
a pair of sense terminals coupled to a first sense contact at a first position on a conductor and a second sense contact at a second position on the conductor, the pair of sense terminals configured to provide an input signal related to a voltage drop across the conductor in a first distance between the first sense contact and the second sense contact, wherein the pair of sense terminals is at least partly accessible from outside the microelectronic package;
at least one processor configured to determine a contribution to the voltage drop due to a test current in the conductor based on the test current and the input signal, wherein the test current is injected into the conductor across a second distance between a first force contact at a third position on the conductor and a second force contact at a fourth position on the conductor via a pair of force terminals coupled to a lock-in-amplifier (LIA), and wherein the first distance is located within the second distance;
a first wiring coupling a first one of the pair of sense terminals with the first sense contact, wherein the first wiring includes a first connector to the LIA;
a second wiring coupling a second one of the pair of sense terminals with the second sense contact, wherein the second wiring comprises a second connector to the LIA, and
wherein the LIA is configured to receive the input signal from the pair of sense terminals via the first wiring and the second wiring,
the at least on processor further configured to determine a contribution to the voltage drop due to a primary current through the conductor; and
the at least on processor further configured to determine the primary current.

9. The device of claim 8, further comprising:
a temperature sensor configured to measure a temperature signal indicative of a temperature,
wherein the at least one processor is configured to determine the primary current based on the temperature signal.

10. The device of claim 9, wherein the temperature sensor is arranged in the microelectronic package such that a sensitive region of the temperature sensor is thermally coupled with an exterior of the microelectronic package.

11. The device of claim 8, further comprising:
a control interface configured to receive a control signal indicating a current transient of the primary current,
wherein the pair of sense terminals is configured to selectively provide the input signal depending on the received control signal.

12. The device of claim 11, further comprising a protection circuit configured to suppress a transient of the input signal based on the received control signal and includes at least one of a series-connected capacitor, a galvanically isolated inductive coupling, a series-connected resistor, and a clamping diode.

13. The device of claim 8, wherein the LIA is configured to determine the voltage drop between the pair of sense terminals from the input signal.

14. The device of claim 13, wherein the LIA is configured to determine a ratio of the voltage drop over a magnitude of the test current, and write the determined ratio into the memory as the predefined reference resistance.

15. The device of claim 8, wherein the LIA is configured to receive the input signal from the pair of sense terminals, and determine a contribution to the voltage drop due to the test current via a lock-in technique, determine a ratio of the contribution over a magnitude of the test current, and write the determined ratio into the memory as the predefined reference resistance.

16. A method, comprising:
injecting, via a pair of force terminals, a test current from a lock-in-amplifier (LIA) into a conductor across a first distance between a first force contact and a second force contact;
receiving, by at least one processor via a pair of sense terminals, an input signal related to a first voltage drop in the conductor across a second distance between a first sense contact and a second sense contact, wherein the second distance is located within the first distance, wherein the pair of sense terminals are coupled to the first sense contact and the second sense contact;
receiving, by the LIA via the pair of sense terminals, the input signal further related to a second voltage drop in the conductor across the second distance between the first sense contact and the second sense contact, wherein a first wiring couples a first one of the pair of sense terminals with the first sense contact and the first wiring includes a first connector to the LIA, a second wiring couples a second one of the pair of sense terminals with the second sense contact and the second wiring comprises a second connector to the LIA, and the LIA is configured to receive the input signal from the pair of sense terminals via the first wiring and the second wiring,
determining, via the LIA, based on the test current and the input signal, a contribution to the second voltage drop due to the test current;
determining, via the at least one processor, a contribution to the voltage drop due to a primary current;
determining, via the LIA, information corresponding to a reference resistance of the conductor based on the input signal, wherein the information is a ratio of the second voltage drop over a magnitude of the test current; and
determining, via the at least one processor, the reference resistance of the conductor based on the information from the LIA, and the primary current based on the contribution to the voltage drop due to the primary current and the reference resistance.

17. The method of claim 16, wherein determining the reference resistance of the conductor and the primary current is executed at a plurality of temperatures, and
wherein the determined reference resistance includes a temperature coefficient of resistivity.

18. The method of claim 16, further comprising:
writing, to a memory, the reference resistance of the conductor.

19. The method of claim 16, wherein the test current is injected into the conductor having a spectral distribution, and
wherein said determining of the contribution to the voltage drop due to the test current is based on at least one of a lock-in technique and a spread-spectrum technique sensitive to the spectral distribution of the test current.

20. The method of claim 19, wherein the spectral distribution resides in a frequency band of 0 Hz-1 MHz.

21. The method of claim 16, wherein the test current is selectively injected into the conductor in intermitted time intervals.

22. The method of claim 16, wherein the test current comprises an alternating current.

23. A system, comprising:
a conductor;
a first force contact coupled to the conductor at a first position;
a second force contact coupled to the conductor at a second position, the first position and the second position being arranged at a first distance with respect to each other;
a pair of force terminals coupled to the first force contact and the second force contact, the pair of force terminals configured to inject a test current into the conductor across the first distance;
a first sense contact coupled to the conductor at a third position;
a second sense contact coupled to the conductor at a fourth position, the third position and the fourth position being arranged at a second distance with respect to each another and located within the first distance;
a device, comprising:
  a microelectronic package;
  a memory configured to store a predefined reference resistance associated with the conductor;
  a pair of sense terminals coupled to the first sense contact and the second sense contact configured to provide an input signal related to a voltage drop across the conductor between the first sense contact and the second sense contact, wherein the pair of sense terminals is at least partly accessible from outside the microelectronic package; and
  at least one processor configured to determine a primary current through the conductor based on the input signal and the predefined reference resistance; and
a substrate having a first conductive layer and a second conductive layer, the second conductive layer contiguously forming the conductor between the first position and the second position,
wherein the first conductive layer has a first thickness and the second conductive layer has a second thickness, wherein the first thickness is less than the second thickness, and
wherein the first conductive layer comprises trace wiring coupling a first one of the pair of sense terminals with the first sense contact, trace wiring coupling a second one of the pair of sense terminals with the second sense contact, trace wiring coupling a first one of the pair of force terminals with the first force contact, and trace wiring coupling a second one of the pair of force terminals with the second force contact.

\* \* \* \* \*